(12) United States Patent
Horie

(10) Patent No.: US 6,955,944 B2
(45) Date of Patent: Oct. 18, 2005

(54) FABRICATION METHOD FOR A SEMICONDUCTOR CSP TYPE PACKAGE

(75) Inventor: Masanao Horie, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 64 days.

(21) Appl. No.: 10/639,580

(22) Filed: Aug. 13, 2003

(65) Prior Publication Data

US 2004/0048415 A1 Mar. 11, 2004

(30) Foreign Application Priority Data

Aug. 14, 2002 (JP) ........................................ 2002-236640

(51) Int. Cl.$^7$ ............................................. H01L 21/44
(52) U.S. Cl. ........................................ 438/106; 438/114
(58) Field of Search ................................. 438/106, 110, 438/112, 113, 114

(56) References Cited

U.S. PATENT DOCUMENTS 6,534,386 B2 * 3/2003 Irie ............................ 438/464

2002/0028525 A1 * 3/2002 Sakamoto et al. ............ 438/17

FOREIGN PATENT DOCUMENTS

JP  2001-15650  1/2001

* cited by examiner

Primary Examiner—Caridad Everhart
(74) Attorney, Agent, or Firm—Young & Thompson

(57) ABSTRACT

A first resin coat layer, which electrically insulates LSI pads and first contact electrodes both formed on each of LSI chips separated from one another, is so designed as to extend farther outward from the peripheral edge of the LSI chip, so that the package is made larger than the LSI chip. An intermediate wire layer and some of second contact electrodes are formed on that part of the first resin coat layer which is formed outside the peripheral edge of the LSI chip. CSP pads and CSP bumps are formed on the second contact electrodes, formed on portions outside the peripheral edge of the LSI chip. Therefore, the pitches of those external terminals can be made wider than the narrow layout pitches of the LSI pads laid out adjacent to one another. This can facilitate the interconnection design on an external board and the fabrication of the CSP type package.

10 Claims, 23 Drawing Sheets

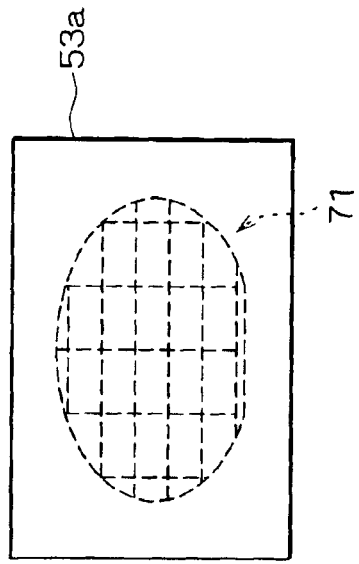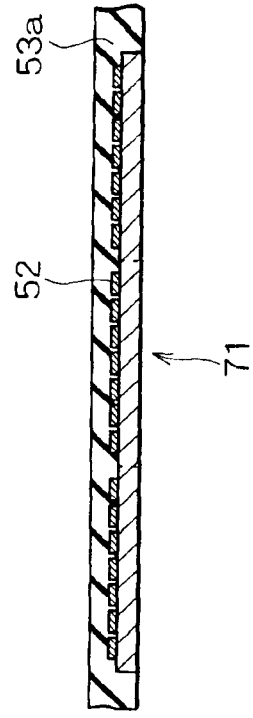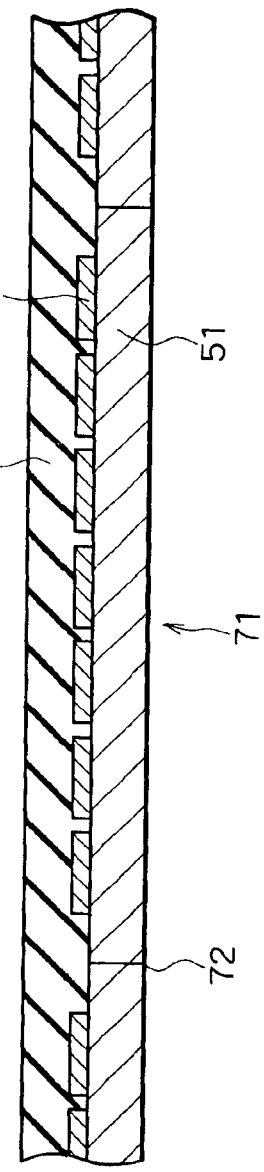
FIG. 9A (PRIOR ART)
FIG. 9B (PRIOR ART)
FIG. 9C (PRIOR ART)

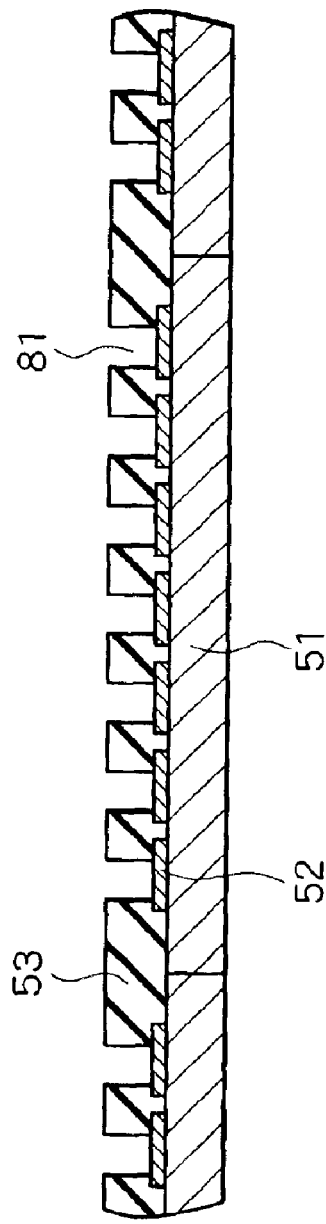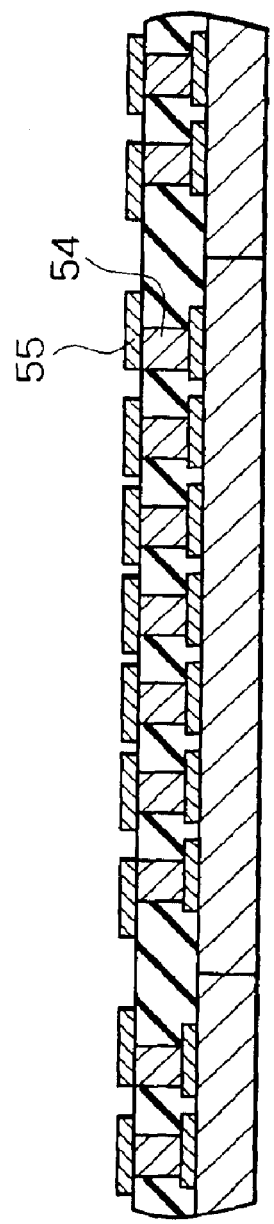

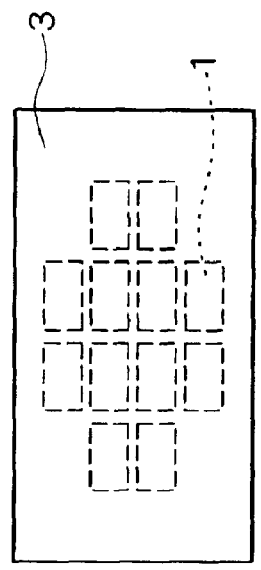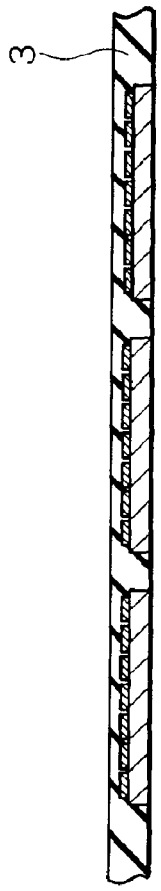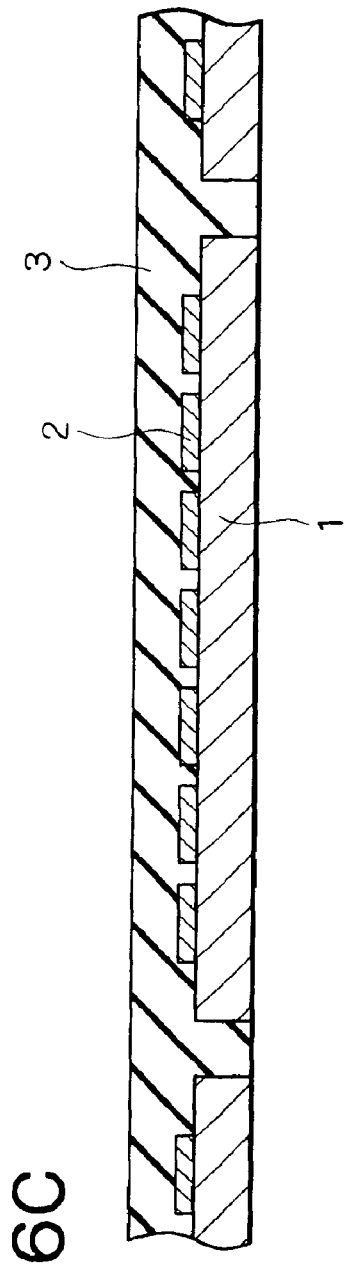
FIG. 16A
FIG. 16B
FIG. 16C

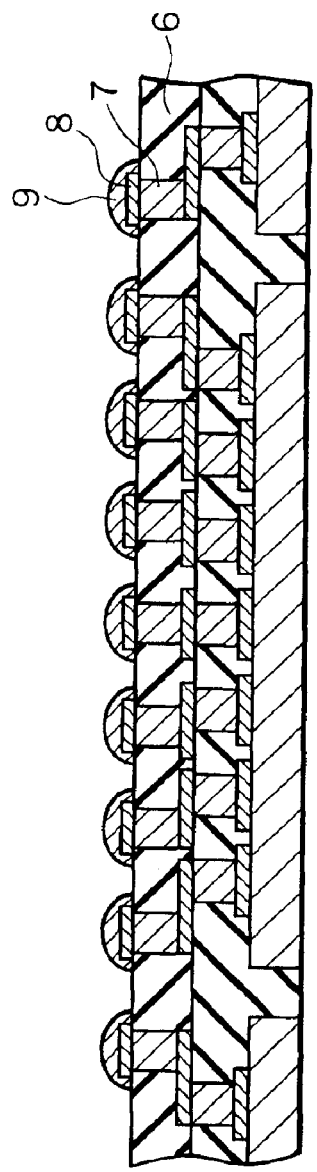
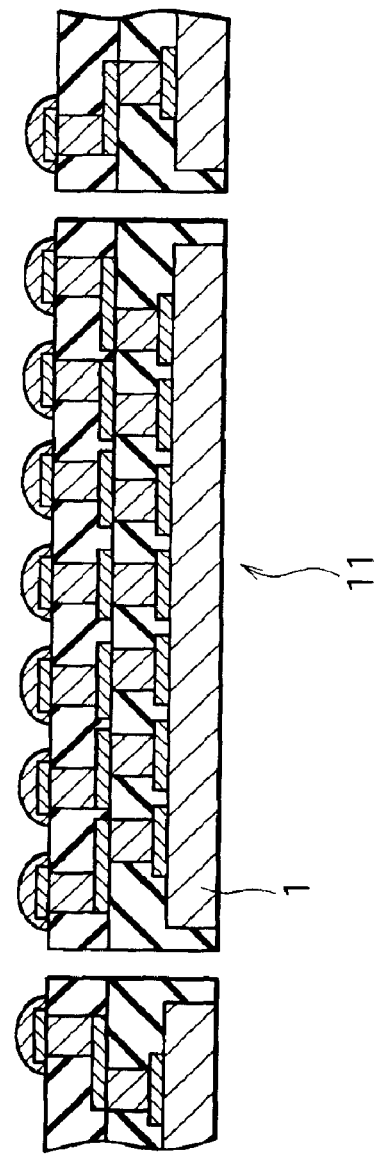
FIG. 18A
FIG. 18B

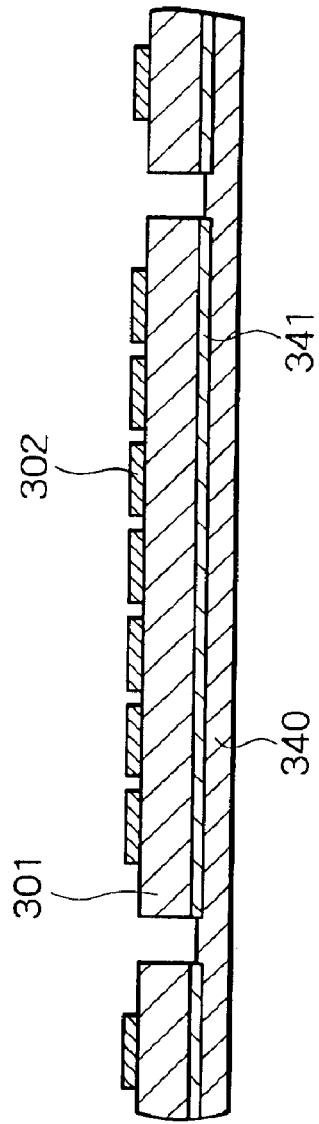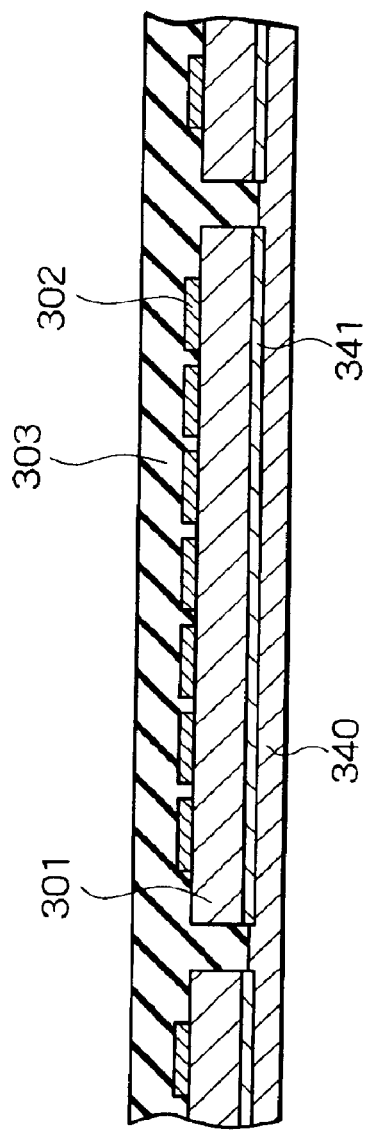

FABRICATION METHOD FOR A SEMICONDUCTOR CSP TYPE PACKAGE

BACKGROUND OF THE INVENTION

1. Field of the Invention

The present invention relates to a fabrication method for a chip size package (CSP) type package which has an LSI (Large Scale Integrated Circuit) mounted therein.

2. Description of the Related Art

Conventional semiconductor CSP type packages for are classified into a build-up type CSP type package and a CSP type package fabricated by the wafer level CSP technology. FIG. 1 is an exemplary cross-sectional view of a conventional build-up type semiconductor CSP type package 110. In the build-up type CSP type package 110, a plurality of CSP pads 103 are formed on the top surface of a substrate 107 made of an organic material, such as glass epoxy or polyimide, and a plurality of external pads 105 are formed on the bottom surface of the substrate 107. The CSP pads 103 are electrically connected to the external pads 105 by CSP internal wires 104 formed inside the substrate 107. Formed respectively on the respective CSP pads 103 are CSP balls 102 on which an LSI chip 101 is mounted. Solder balls 106 are formed on the respective external pads 105 formed on the bottom surface of the substrate 107. The LSI chip 101 is electrically connected to the CSP internal wires 104, formed inside the substrate 107, via the CSP balls 102 and the CSP pads 103. The CSP internal wires 104 are electrically connected to an external board (not shown), such as a printed circuit board, via the external pads 105 and the solder balls 106.

FIG. 2A to FIG. 5B illustrate a fabrication method for the build-up type semiconductor CSP type package 110 according to the prior art. In the fabrication method for the conventional build-up type semiconductor CSP type package, as shown in FIG. 2A, first a plurality of via holes 107b penetrating through a substrate core member 107a, made of an organic material, such as glass epoxy or polyimide, are bored at desired positions on the substrate core member 107a. Next, a metal film of aluminum, copper or the like is deposited on the entire surface of the substrate core member 107a having the via holes 107b bored therein by a known plating technology, and at the same time, the via holes 107b are buried with the same metal. Then, wires are patterned by known photolithography and etching technologies, thereby forming a wiring pattern 104 as shown in FIG. 2B. Then, a lamination plate 107d made of an organic material, such as glass epoxy or polyimide, is adhered to both sides of the substrate core member 107a with the wiring pattern 104, and a plurality of via holes 107c are formed in those lamination plates 107d, as shown in FIG. 2C. Next, in the manner mentioned above, the via holes 107c formed in the lamination plates 107d are buried with the metal by the known plating technology and the wiring pattern 104 is formed on those surfaces of the lamination plates 107d which are not adhered to the substrate core member 107a by the photolithography technology and the etching technology. As shown in FIG. 124D, the process of burying the via holes 107c with the metal to form the wiring pattern 104 forms the CSP pads 103 and the external pads 105 on the surfaces of the lamination plates 107d simultaneously. Then, a protection film 107e is formed on the entire surface of each lamination plate 107d by a known coating scheme. Finally, the process that combines the photolithography technology and etching technology or the like removes the protection films 107e formed on the CSP pads 103 and the external pads 105 and provides openings through which the CSP pads 103 and external pads 105 are electrically connected to the outside.

The substrate 107 fabricated in the above manner is electrically connected to the LSI chip 101 via the CSP balls 102 as shown in FIG. 3, and is electrically connected to an external board (not shown), such as a printed circuit board, via the solder balls 106. In the process of mounting the LSI chip 101 on the substrate 107 and assembling the build-up type semiconductor CSP type package 110, first, the CSP balls 102 are arranged on LSI pad electrodes (not shown) formed on the surface of the LSI chip 101. After alignment is carried out in such a way that the CSP balls 102 are aligned with the CSP pads 103 formed on the substrate 107, the LSI chip 101 is mounted on the substrate 107. Eutectic solder, leadless solder or the like is used for the CSP balls 102. Solder bumps or gold bumps may be used instead of the CSP balls 102. At the time of mounting the LSI chip 101 on the substrate 107, for example, a metal flux or the like is coated on the surfaces of the CSP pads 103 after which the CSP balls 102 on the LSI chip 101 are pressure-bonded to the CSP pads 103 on the substrate 107 to be physically and electrically connected together while being heated at a temperature of around about 210° C. in case of using eutectic solder for the CSP balls 102 or at a temperature of around about 260° C. in case of using leadless solder for the CSP balls 102. In case where gold bumps are used instead of the CSP balls 102, the heating temperature is often set to around about 300° C. Next, the solder balls 106 are adhered onto the external pads 105 on the substrate 107 having the LSI chip 101 mounted thereon by using a method similar to the method of connecting the CSP balls 102 to the CSP pads 103. Bumps may be used in place of the solder balls 106. The solder balls 106 may be attached to the substrate 107 after fabrication of the substrate 107 but before mounting of the LSI chip 101 on the substrate 107.

The fabrication process for the substrate 107 is carried out with a plurality of substrates 107 linked to one another by a frame 111 as shown in FIG. 4A. Then, after those substrates 107 are cut out of the frame 111, the LSI chip 101 is mounted on each separated substrate 107 to assemble the build-up type CSP type package 110, as shown in FIG. 4B. In another available method, after multiple CSP type packages 110 are fabricated as a single CSP aggregation 112 as shown in FIG. 5A, LSI chips 101 are mounted on the LSI-chip mount portions of the respective CSP type packages 110, then the respective CSP type packages 110 with the LSI chips 101 mounted thereon are cut out as shown in FIG. 5B.

Such build-up type semiconductor CSP type packages are actually used to meet the demands of miniaturization of packages and higher package density that have been made with the recent improvements on the scale of LSIs. In various kinds of semiconductor packaging, the multi-pin layout and multilayering that have been taken to cope with an increase in the number of wires are advancing rapidly. In the build-up type CSP type packages, the multi-pin layout and multilayering, designed to cope with an increase in the number of wires, are coped with, for example, a scheme of laminating substrates made of an organic base material, such as glass epoxy or polyimide. In the conventional build-up type CSP type packages, however, the lamination of substrates made of an organic base material, such as glass epoxy or polyimide, to achieve the multi-pin layout and multilayering brings about a problem of making such a package heavy. Further, the multi-pin layout and multilayering on the package level increase the number of steps required in the fabrication and make the fabrication time longer. This leads to an increase in the manufacturing cost including the development cost and increases the unit price of fabricated packages.

In the wafer level CSP technology according to another prior art, a package fabricating process and the LSI chip assembling process are integrated. This prior art therefore reduces the packaging cost significantly and can fabricate a semiconductor CSP type package with an LSI chip mounted therein at a high density with a size equal to or slightly larger than the size of the LSI chip. The wafer level CSP technology can therefore fabricate smaller semiconductor CSP type packages at a higher density at a lower cost as compared with the technology of fabricating build-up type CSP type packages.

FIG. 6 to FIG. 11B illustrate a fabrication process for a semiconductor CSP type package according to the invention the conventional wafer level CSP technology. FIG. 6 is a cross-sectional view of a semiconductor CSP type package 61 according to the conventional wafer level CSP technology. In the semiconductor CSP type package 61, as shown in FIG. 6, LSI pads 52 are formed on an LSI chip 51 as electrodes to obtain electrical connection from the LSI chip 51. The entire surface of the LSI chip 51, excluding those portions where the LSI pads 52 are formed, is covered with a first resin coat layer 53. First contact electrodes 54 are formed on the LSI pads 52 to obtain electrical connection from the LSI chip 51 via the LSI pads 52. An intermediate wire layer 55 which routes out wires to transmit electrical signals into the semiconductor CSP type package 61 is formed on parts of the first resin coat layer 53 including those lying above the first contact electrodes 54. Second contact electrodes 57 are formed on parts of the intermediate wire layer 55, and an insulative second resin coat layer 56 buries an area around each second contact electrode 57, excluding that portion lying above the second contact electrode 57, to electrically isolate the second contact electrodes 57 from one another. CSP pads 58 are formed on those portions of the second contact electrodes 57 which are not covered with the second resin coat layer 56 as electrodes to transmit electrical signals from the LSI chip 51 to an external board or the like (not shown). CSP bumps 59 which become external output terminals of the semiconductor CSP type package 61 are formed in such a way as to cover the CSP pads 58. The semiconductor CSP type package 61 according to the wafer level CSP technology is connected to connection terminals of an external wire substrate or the like (not shown), such as a printed circuit board, via the CSP bumps 59.

In the conventional semiconductor CSP type package 61 according to the wafer level CSP technology, as electrical signals output from the LSI chip 51 pass the LSI pads 52, the first contact electrodes 54, the intermediate wire layer 55, the second contact electrodes 57, the CSP pads 58 and the CSP bumps 59 in order, the electrical signals are transmitted to a wire board or the like, such as a printed circuit board, outside the semiconductor CSP type package 61. As electrical signals from a wire board or the like, such as a printed circuit board, outside the semiconductor CSP type package 61 pass in the route in the reverse order, the electrical signals are transmitted to the LSI chip 51h. The CSP bumps 59 are arranged at arbitrary positions inside LSI chip side lines 60 which are the periphery of the semiconductor CSP type package 61 as the intermediate wire layer 55 is routed around within the semiconductor CSP type package 61. Although FIG. 6 shows an example where only a single intermediate wire layer 55 is provided, there is no restriction on the number of intermediate wire layers 55 and a plurality of intermediate wire layers 55 technically allowable can be formed.

FIG. 7 is a plan view of the semiconductor CSP type package 61 according to the conventional wafer level CSP technology. The LSI chip 51 and the semiconductor CSP type package 61 are almost equal in size. The positions of the LSI pads 52 do not necessarily coincide with the positions of the CSP bumps 59 but are arranged extremely close thereto.

A description will now be given of the method of fabricating a semiconductor CSP type package according to the wafer level CSP technology. FIG. 8A shows a wafer 71 which has undergone the diffusion process or the final process of the wafer process (preprocess of semiconductor fabrication). Scribe lines 72 or the boundary lines of the individual LSI chips 51 run vertically and horizontally on the surface of the wafer 71 whose wafer process has been completed. FIG. 8B shows the cross section of the wafer 71. Formed on each LSI chip 51 formed on the surface of the wafer 71 by the wafer process are the LSI pads 52 that connect the LSI chip 51 to the semiconductor CSP type package 61 on which the LSI chip 51 is mounted. The LSI pads 52 are formed by depositing a metal, such as aluminum, on the entire surface of the wafer 71 by known CVD (Chemical Vapor Deposition), then patterning a pad pattern by known photolithography and etching technologies. The entire surface of the wafer 71, excluding those portions lying above the LSI pads 52, is covered with an insulative film (not shown) of silicon oxide, silicon nitride, polyimide or the like. This can allow the wafer 71 to keep the electrical insulation and protect the wafer 71 against mechanical and chemical impacts.

According to the conventional wafer level CSP technology, as shown in FIGS. 9A to 9C, first, the first resin coat layer 53 is formed in such a way as to cover the entire surface of the wafer 71. FIG. 9A is a plan view illustrating the fabrication method for the semiconductor CSP type package according to the conventional wafer level CSP technology, FIG. 9B is a cross-sectional view of the semiconductor CSP type package, and FIG. 9C is a partly enlarged view of the semiconductor CSP type package in FIG. 9B. One way of forming the first resin coat layer 53 is to coat a thermosetting polyimide having a high thermal fluidity on the wafer 71 by a known spin coating scheme or the like and then heating the wafer 71 to a temperature of 100° C. to 150° C. to cure the coated film of polyimide, thereby providing a resin coat layer. Another method is to adhere a thin resin sealing film 53a onto the wafer 71. In the method of adhering the thin resin sealing film 53a on the wafer 71, the wafer 71 adhered with the thin resin sealing film 53a is held by a hot plate or the like and heated to about 100° C. to pressure-bonding the thin resin sealing film 53a onto the entire surface of the wafer 71, thereby forming the first resin coat layer 53.

Next, a photoresist is applied onto the wafer 71 with the first resin coat layer 53 formed thereon and the photoresist applied onto the first resin coat layer 53 that is formed on the LSI pads 52 on the wafer 71 is removed by the known photolithography technology. Then, the first resin coat layer 53 on the LSI pads 52 is removed by the known etching technology or laser processing technology or the like to thereby form contact holes 81 in the LSI pads 52 as shown in FIG. 10A.

Next, a metal film of as aluminum, copper or the like is formed on the entire surface of the wafer 71 having the contact holes 81 formed therein by using the known plating technology. Accordingly, the contact holes 81 are buried with the metal, such as aluminum or copper. The metal that is deposited on the other portion of the surface of the wafer 71 than the contact holes 81 is removed by a known etch-back technology or the like. As the contact holes 81 are buried with the metal, such as aluminum or copper, this way, the first contact electrodes 54 are formed. In addition to the contact electrode forming method that employs the combination of the etching technology and the plating technology, there is another known method which forms the first resin coat layer 53 and the first contact electrodes 54 by forming columnar posts of metal such as copper before forming the first resin coat layer 53 and then covering the posts with an insulative resin using a known mold sealing technique.

Next, metal, such as copper or gold, is deposited on the entire surface of the wafer 71 with the first contact electrodes 54 formed thereon by the known plating technology and the intermediate wire layer 55 is formed on the first resin coat layer 53 including those portions above the first contact electrodes 54 as shown in FIG. 132B by the known photolithography and etching technologies.

Then, the second resin coat layer 56 is formed in the same method as used in forming the first resin coat layer 53, and the second contact electrodes 57 and the CSP pads 58 are formed in the same method as used in forming the first contact electrodes 54. Metal, such as aluminum or copper, is pressure-bonded onto the CSP pads 58 while being heated using a dispenser, thus forming the CSP bumps 59 as shown in FIG. 11A. Instead of the CSP bumps 59, solder balls may be used.

Finally, the wafer 71 with the CSP bumps 59 formed thereon is cut away along the scribe lines 72 by a diamond cutter, a laser or the like, yielding individual semiconductor CSP type packages 61.

The conventional semiconductor CSP type packages according to the wafer level CSP technology, which are fabricated in the above-described manner, do not raise the problem of the build-up type CSP type packages such that the weight is significantly increased due to the multi-pin layout and multilayering on the package level.

With the recent larger scale integration of LSIs, however, the pitches of the external terminals or the connection portions to an external board, such as a printed circuit board, tends to become extremely narrower in the conventional semiconductor CSP type packages according to the wafer level CSP technology. A socket is used in a test of checking the functional operation of an LSI (hereinafter referred to as "screening process") after the LSI chip is mounted in the package. If the socket that corresponds to the very narrow pitches of the external terminals is selected, it becomes very expensive. In the semiconductor CSP type package according to the wafer level CSP technology, the pitches of the external terminals are about 400 μm or less and the intervals between the terminals are generally about 100 μm. This restricts the number of wires that run between terminals on an external board, such as a printed circuit board. Therefore, an external board, such as a printed circuit board, should face with the increasing necessity of achieving multilayering of wire layers, thus raising the problems of a cost increase, the extension of the fabrication period and so forth. While the semiconductor CSP type package according to the wafer level CSP technology suffer the prominent problem originated from the extremely narrow pitches of the contact terminals to an external board, the conventional wafer level CSP technology suffers a limitation to the area where the external terminals can be provided due to the package size being determined by the size of the LSI chip to be mounted. Therefore, widening the pitches of the external terminals reduces the number of the providable external terminals, thus limiting the degree of freedom on the interconnection design.

Japanese Patent Laid-Open No. 2001-15650 points out the problem of short-circuiting of interconnections that would originate from melting of solder bumps on the external terminals adjoining to one another at the extremely narrow pitches at the time of connecting the external terminals to an external board, such as a printed circuit board, and discloses the technique of mounting a semiconductor CSP type package on an external board by connecting the external terminals to the wire conductors without soldering but by metal plating.

Of many problems that would arise due to the very narrow pitches of the external terminals, however, only the problem of wire short-circuiting that would occur on the external terminals is overcome by the prior art, but the other problems are not overcome. In other words, the prior art fails to teach or suggest the ways of facilitating the wire layout design on an external board and avoiding the multilayering of wires on the external board, thereby suppressing an increase in fabrication cost and shortening the fabrication period. Therefore, the prior art does not disclose any specific means of solving the problem that would occur from the package size being determined by the size of the LSI chip to be mounted.

SUMMARY OF THE INVENTION

Accordingly, it is an object of the invention to provide a fabrication method for a semiconductor CSP type package which secures about the same pitches of external terminals as those of a build-up type CSP type package using the wafer level CSP technology which can make the size and weight smaller and lighter than those of the build-up type CSP type package.

To achieve the object, according to one aspect of the invention, there is provided a fabrication method for a semiconductor CSP type package, comprising the steps of cutting a wafer on which LSI chips are formed to separate the LSI chips; providing gaps around the LSI chips at equal intervals to array the LSI chips; and burying the gaps with an LSI chips insulative resin to expand a wire forming area, thereby providing an external-terminal mounting area extending farther outward from a peripheral edge of each of the LSI chips.

Each of the LSI chips may have an alignment mark for photolithography and the alignment mark is used to align patterning on the each LSI chip in the step of forming the wire forming area and the external-terminal mounting area.

It is preferable that the LSI chips should be only those chips which have been screened as good after separation.

The LSI chips can be adhered to a substrate with the gaps provided.

The gaps may be provided by adhering the wafer to an spreadable sheet, then cutting the wafer to separate the LSI chips and stretching the sheet isotropically.

BRIEF DESCRIPTION OF THE DRAWINGS

FIGS. 9A to 9C are diagrams illustrating a fabrication process following the process shown in FIGS. 8A and 8B;

FIGS. 10A and 10B are cross-sectional views illustrating a fabrication process following the process shown in FIGS. 8A to 8C;

FIGS. 16A to 16C are diagrams illustrating a fabrication process following the process shown in FIGS. 15A and 15B;

FIGS. 18A and 18B are cross-sectional views illustrating a fabrication process following the process shown in FIGS. 17A and 17B;

FIGS. 22A and 22B are diagrams illustrating a fabrication process for a third embodiment of the invention.

DETAILED DESCRIPTION OF THE PREFERRED EMBODIMENTS

Figure 1:
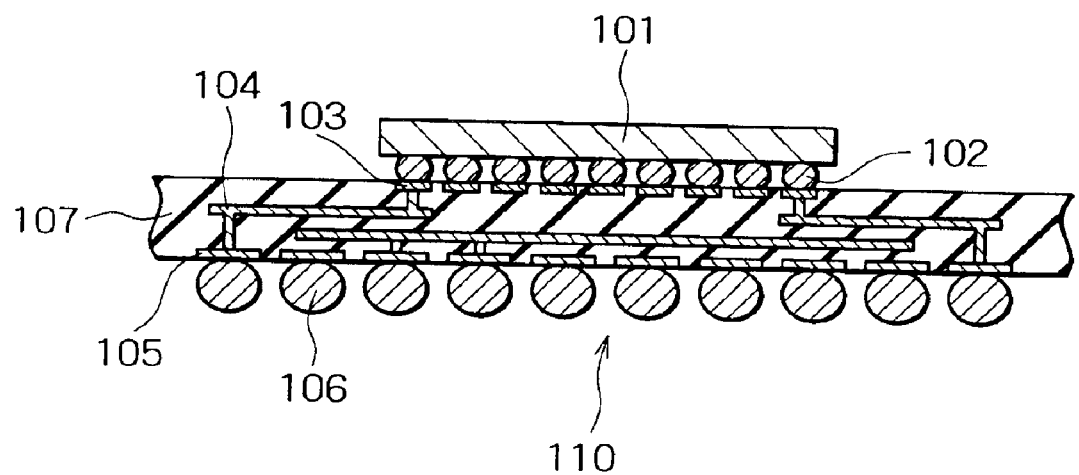
FIG. 1 is a cross-sectional view showing a conventional build-up type CSP type package.
Figure 2A:
FIGS. 2A to 2D are cross-sectional views illustrating a fabrication process for the conventional build-up type CSP type package.
Figure 2B:
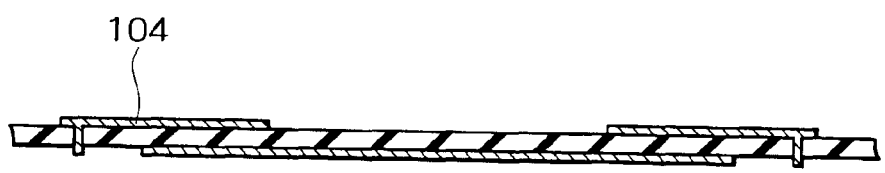
Figure 2C:
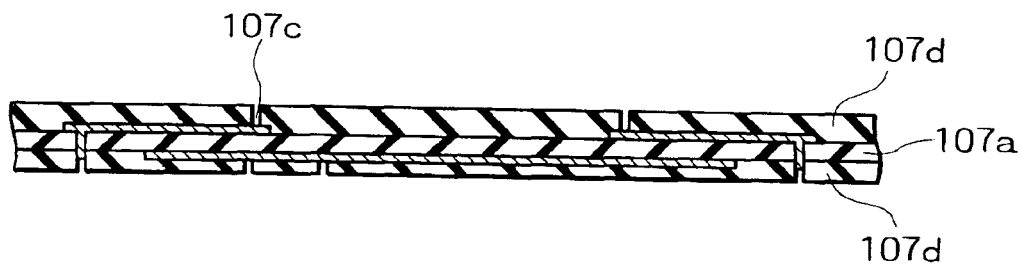
Figure 2D:
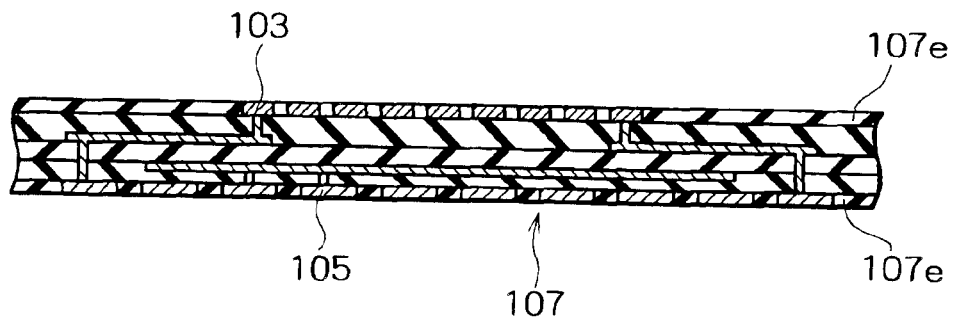
Figure 3:
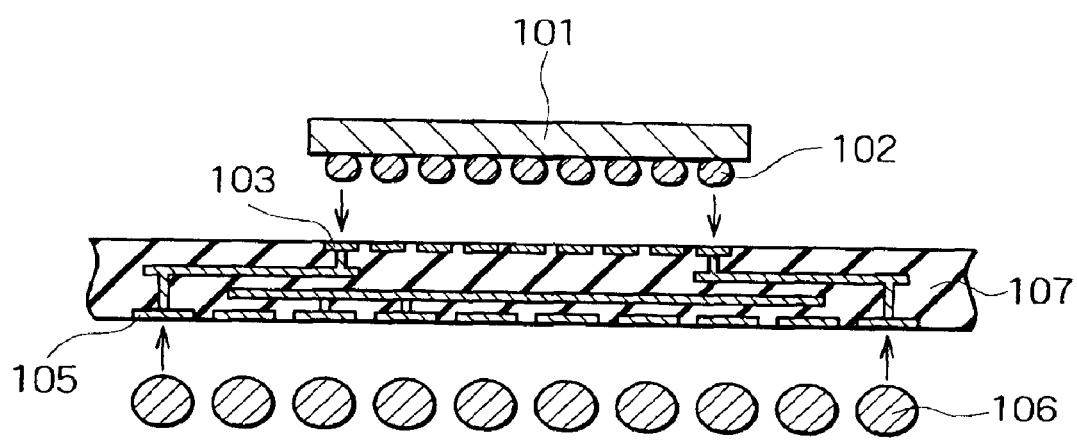
FIG. 3 is a cross-sectional view showing a fabrication process following the process shown in FIGS. 2A to 2D.
Figure 4A:
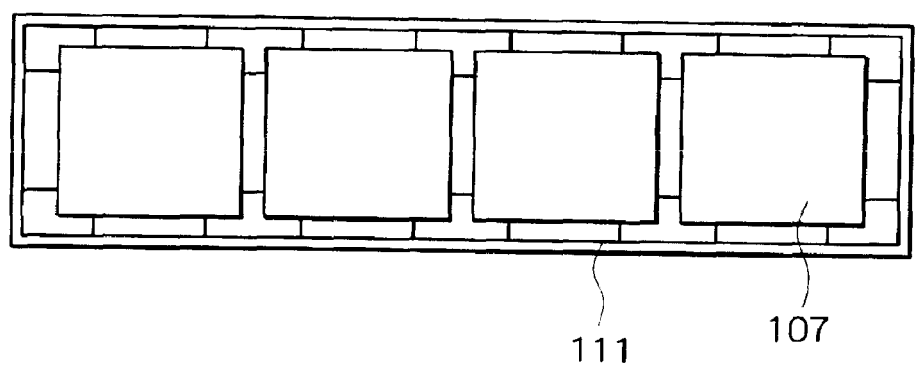
FIGS. 4a and 4B are plan views illustrating a fabrication process following the process shown in FIG. 3.
Figure 4B:
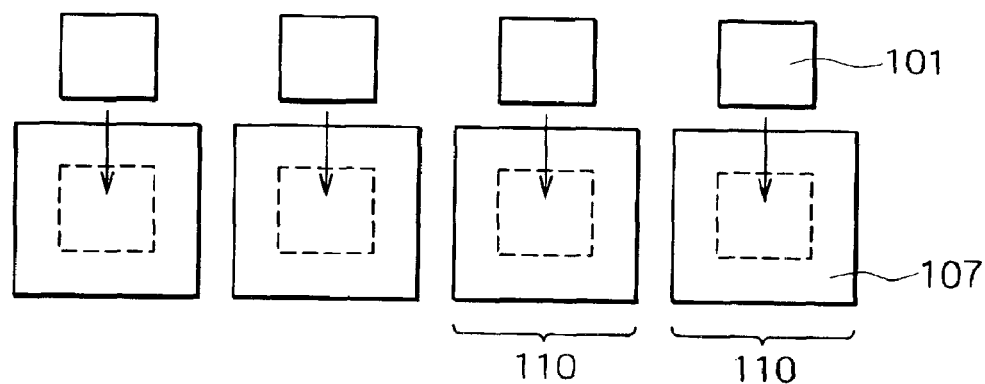
Figure 5A:
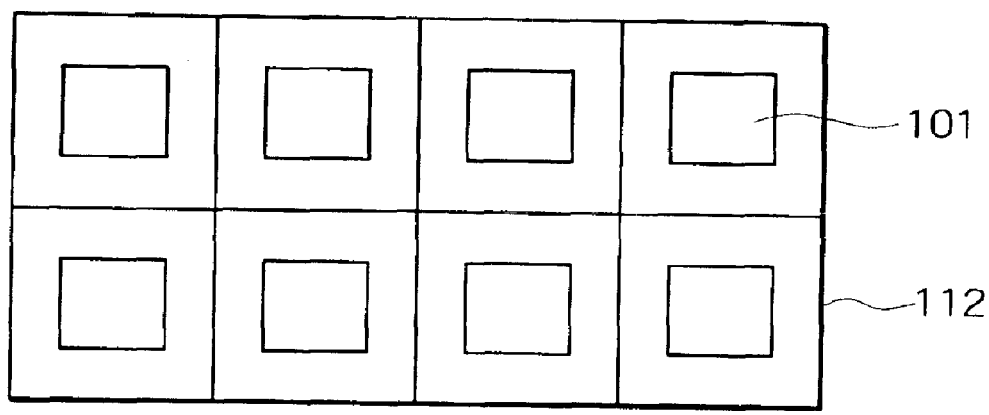
FIGS. 5A and 5B are plan views illustrating another fabrication process following the process shown in FIG. 3.
Figure 5B:
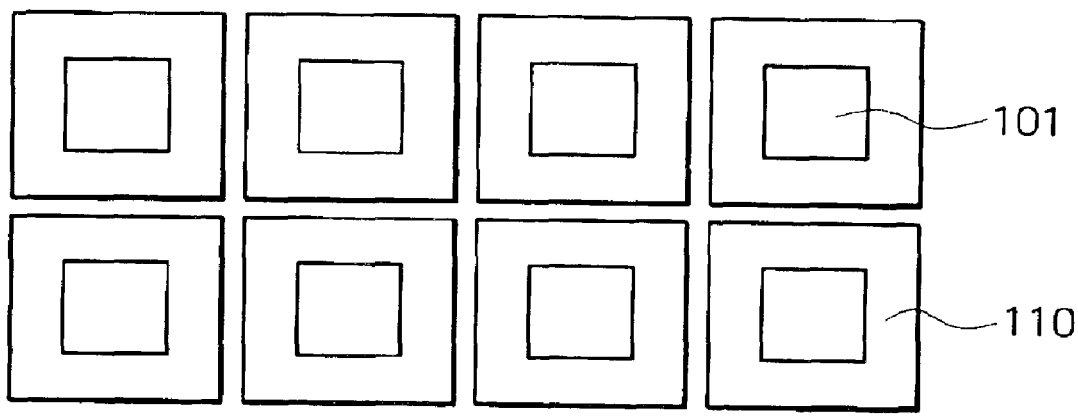
Figure 6:
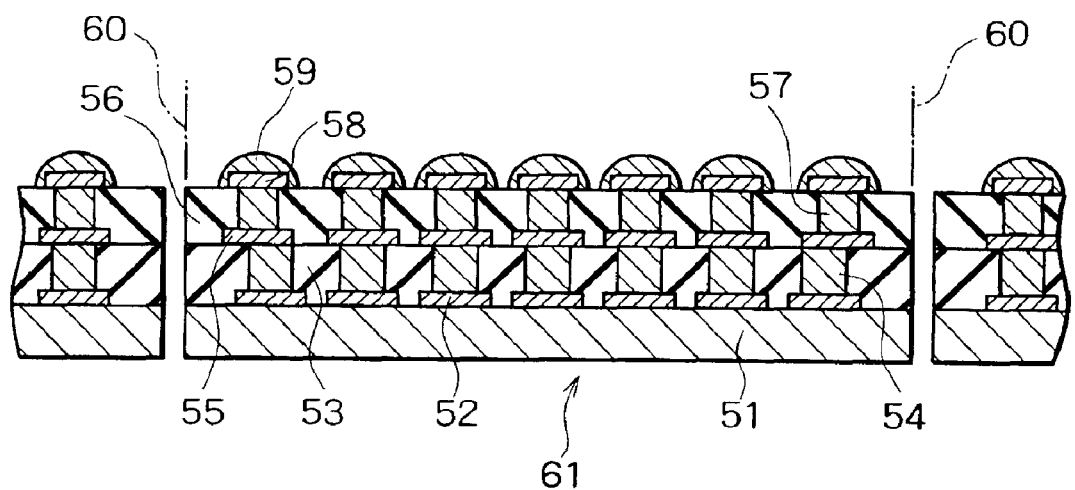
FIG. 6 is a cross-sectional view showing a conventional CSP type package according to the wafer level CSP technology.
Figure 7:
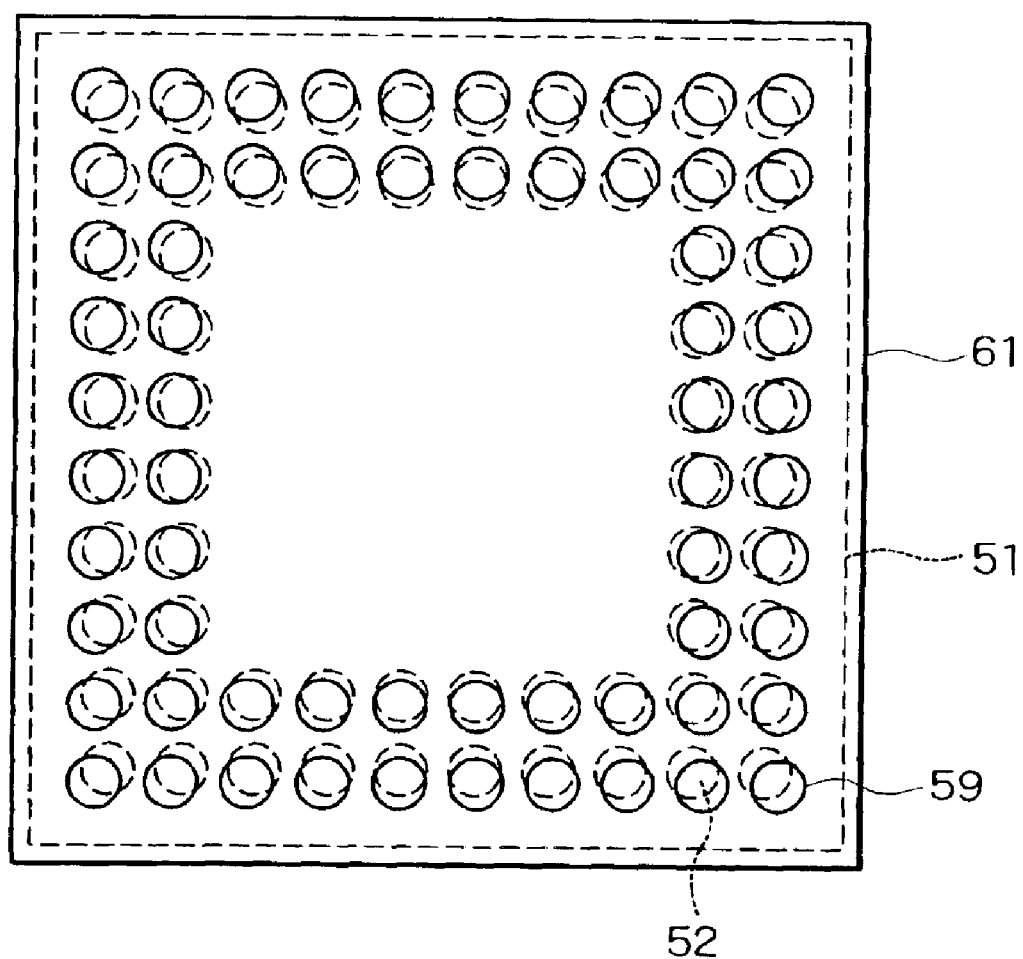
FIG. 7 is a plan view showing the conventional CSP type package according to the wafer level CSP technology.
Figure 8A:
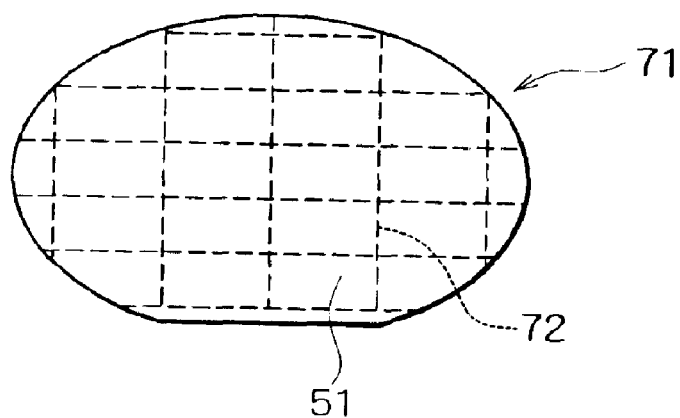
FIGS. 8A and 8B are diagrams illustrating a fabrication process for the conventional CSP type package according to the wafer level CSP technology.
Figure 8B:
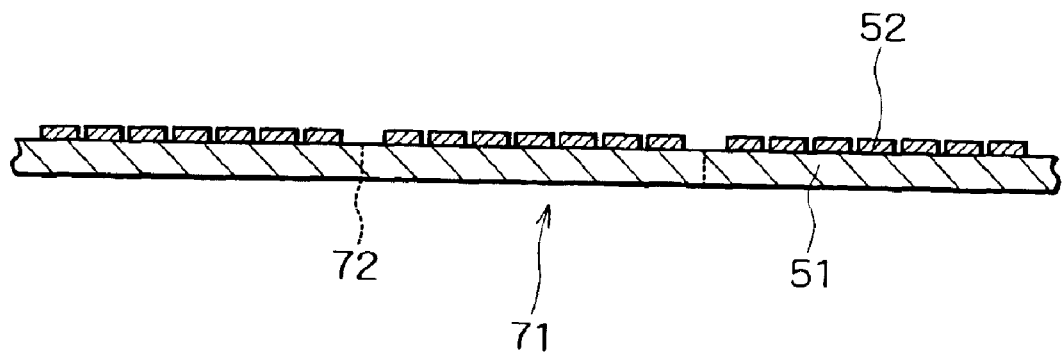
Figure 11A:
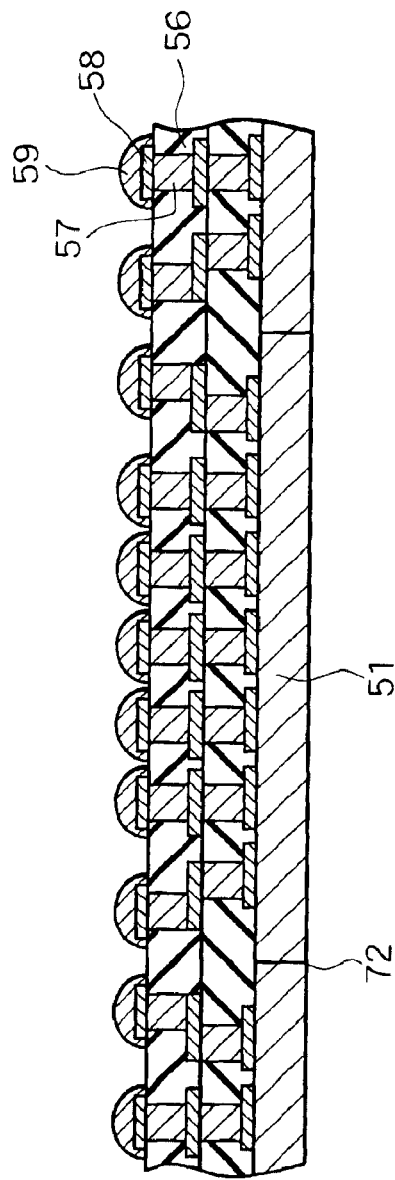
FIGS. 11A and 11B are cross-sectional views illustrating a fabrication process following the process shown in FIGS. 10A and 10B.
Figure 11B:
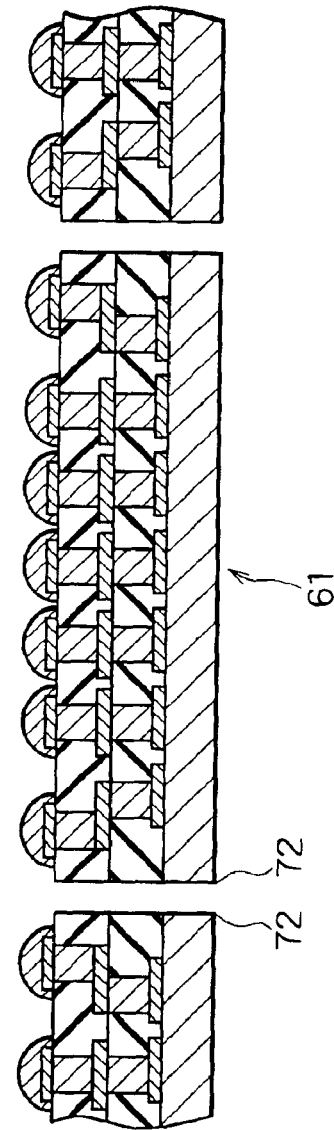
Figure 12:
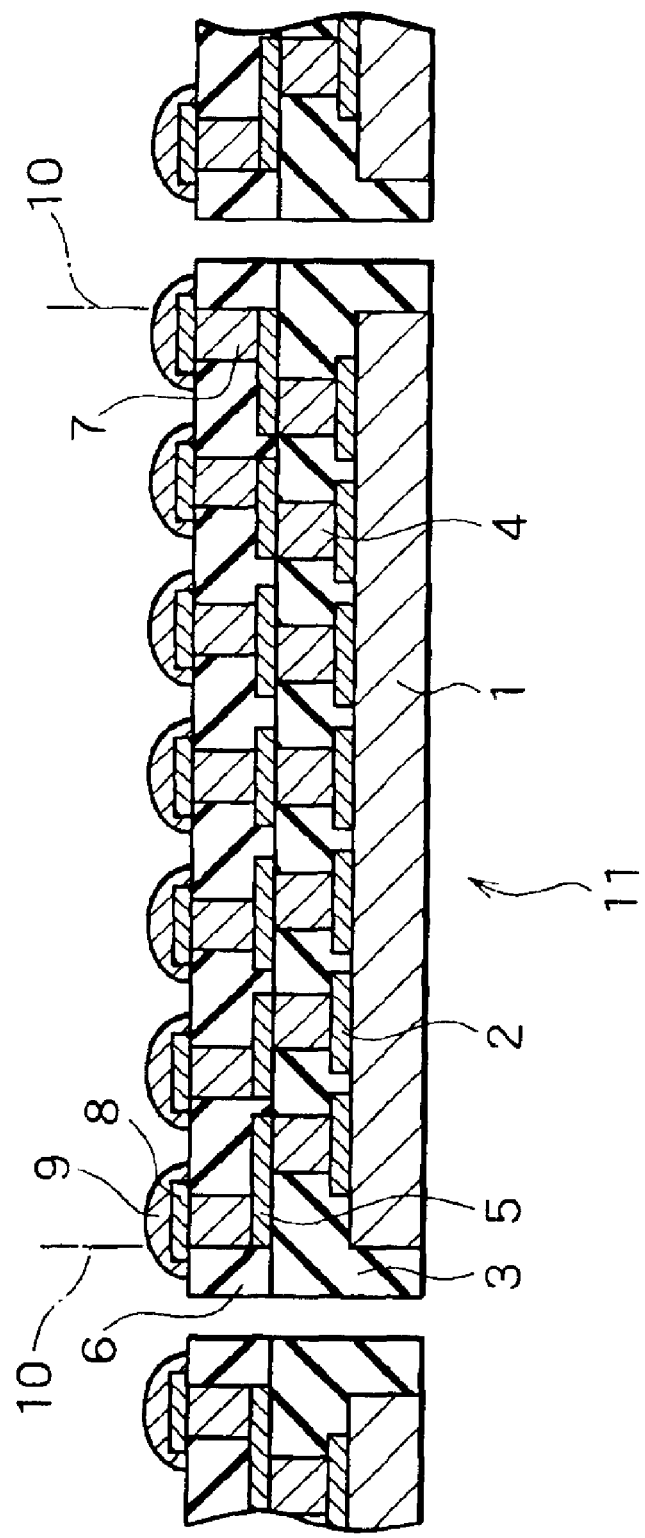
FIG. 12 is a cross-sectional view showing a first embodiment of the present invention.
Figure 13:
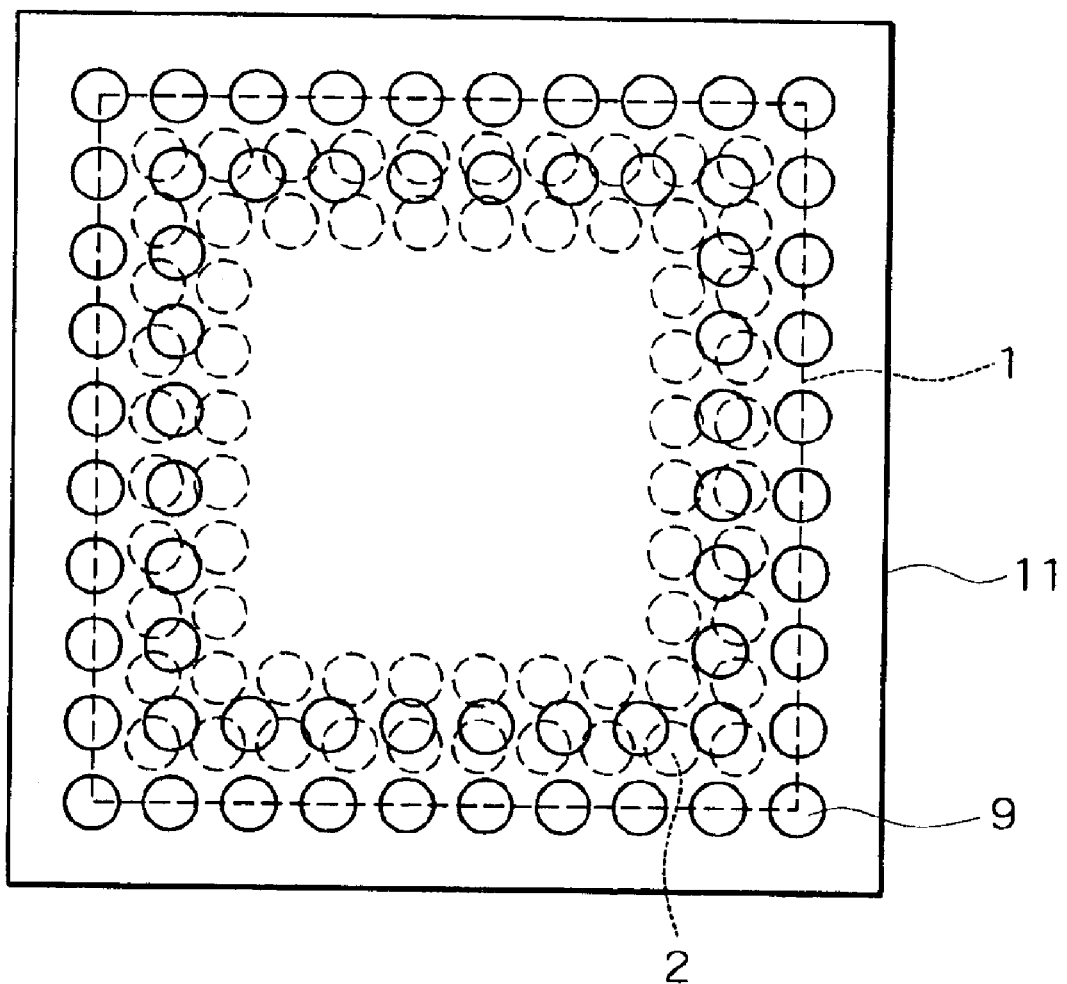
FIG. 13 is a plan view showing the first embodiment of the invention.

Preferred embodiments of the invention will be described below specifically with reference to the accompanying drawings. FIG. 12 is a cross-sectional view of a semiconductor CSP type package according to the first embodiment of the invention, and FIG. 13 is a plan view of the first embodiment. FIGS. 14A to 18B are diagrams illustrating a fabrication process for the semiconductor CSP type package according to the first embodiment.

In the embodiment, as shown in FIG. 12, LSI pads 2 are formed on an LSI chip 1 fabricated with a silicon wafer as a substrate as electrodes to obtain electrical connection from the LSI chip 1. That surface of the LSI chip 1 on which the LSI pads 2 are formed and the side surfaces of the LSI chip 1 are entirely covered with a first resin coat layer 3. First contact electrodes 4 are formed on the LSI pads 2 to obtain electrical connection from the LSI chip 1 via the LSI pads 2. An intermediate wire layer 5 is formed on parts of the first resin coat layer 3 including those lying above the first contact electrodes 4. A part of the intermediate wire layer 5 extends farther outward from the peripheral edge of the LSI chip 1 and is formed on the first resin coat layer 3 that is formed outside the peripheral edge of the LSI chip 1. Second contact electrodes 7 for acquiring electrical connection from the intermediate wire layer 5 are formed on parts of the intermediate wire layer 5. A second resin coat layer 6 buries an area around each second contact electrode 7, excluding that portion lying above the second contact electrode 7, to electrically isolate the second contact electrodes 7 from one another. CSP pads 8 are formed on those portions of the second contact electrodes 7 which are not covered with the second resin coat layer 6 as electrodes to transmit electrical signals from the LSI chip 1 to the outside. CSP bumps 9 which serve as external terminals of the semiconductor CSP type package 11 are formed in such a way as to cover the CSP pads 8. Some of the CSP pads 8 and the CSP bumps 9 extend farther outward from the peripheral edge of the LSI chip 1 and are formed outside the peripheral edge of the LSI chip 1 and are not necessarily be formed on the LSI pads 2. The semiconductor CSP type package 11 is physically and electrically connected to connection terminals (not shown) of an external wire substrate or the like, such as a printed circuit board, via the CSP bumps 9. Although FIG. 12 shows the semiconductor CSP type package which has only a single intermediate wire layer 5, the number of the intermediate wire layers 5 is not particularly limited and two or more intermediate wire layers 5 can be formed as needed.

The outer size of the semiconductor CSP type package 11 according to the embodiment is larger than that of the LSI chip 1 which is mounted in the CSP type package 11 as shown in FIG. 13. It is therefore possible to form the CSP bumps 9 outside the LSI chip 1, extending outward from the LSI chip side lines indicating the peripheral edge of the LSI chip 1. Therefore, the CSP bumps 9 are laid out at wider pitches as compared with the LSI pads 2 laid out adjacent to one another at very narrow pitches.

Figure 14A:
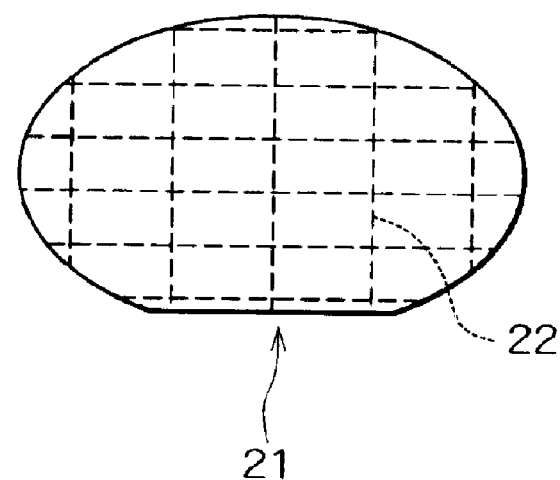
FIGS. 14A and 14B are diagrams illustrating a fabrication process for the first embodiment of the invention.
Figure 14B:
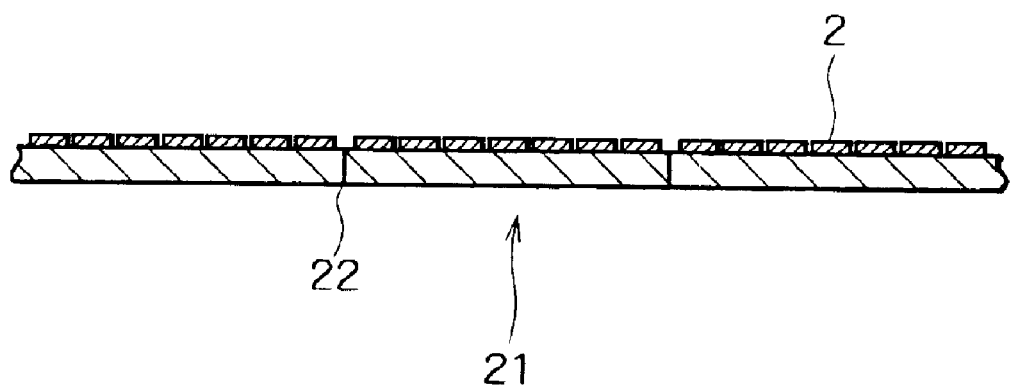
Figure 15A:
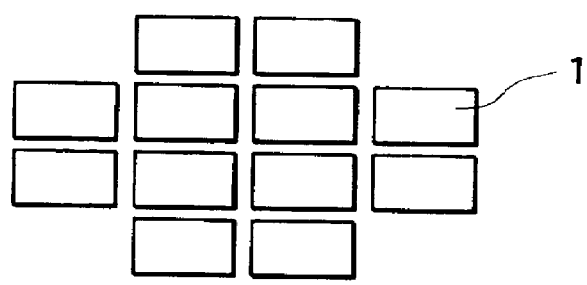
FIGS. 15A and 15B are diagrams illustrating a fabrication process following the process shown in FIGS. 14A and 14B.
Figure 15B:
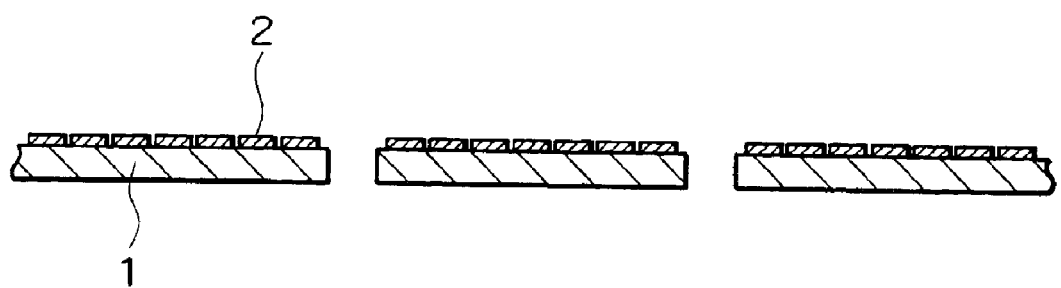

FIG. 14A to FIG. 18B are diagrams illustrating a fabrication process for the semiconductor CSP type package 11 according to the first embodiment. FIG. 14A is a plan view showing the fabrication process according to the first embodiment and FIG. 14B is a cross-sectional view. In the fabrication process of the embodiment, as shown in FIGS. 14A and 14B, first, nicks are made along scribe lines 22 on a wafer 21 which has undergone the diffusion process or final process of the wafer process and where LSI chips are formed. Then, the nicked wafer 21 is adhered onto a sheet or the like, such as an electron sheet or an epoxy resin film, which can easily be spread, and is cut by dicing. Next, the sheet or the like to which the wafer 21 is adhered is stretched uniformly and isotropically to separate the LSI chips 1 formed on the wafer 21 to individual pieces and providing gaps of equal intervals around the LSI chips 1, as shown in FIG. 15A. As shown in FIG. 15B, the LSI pads 2 have already been provide on each separated LSI chip 1 by the wafer process.

Next, as shown in FIG. 16A, a thermosetting resin with a low viscosity which is used for a wafer coat material or the like is uniformly applied in such a way as to entire cover each separated LSI chip 1 and is heated to a temperature of about 100° C. to 300° C. to be cured, thereby forming the first resin coat layer 3. As shown in FIG. 16B and FIG. 16C which is a partly enlarged diagram of FIG. 16B, the first resin coat layer 3 covers the top surface of the and side surfaces of each LSI chip 1 entire to bury the gap provided around the LSI chip 1.

Figure 17A:
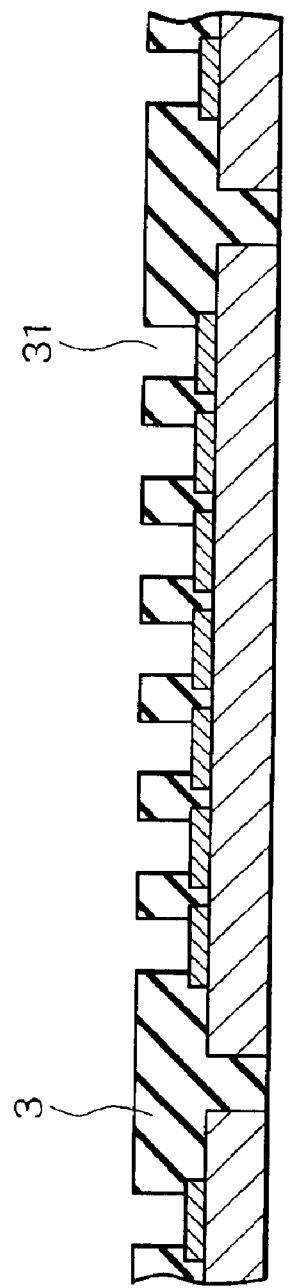
FIGS. 17A and 17B are cross-sectional views illustrating a fabrication process following the process shown in FIGS. 16A to 16C.

Next, a photoresist is applied onto the ensure surface of the wafer 21 which has been separated and stretched and is formed with the first resin coat layer 3, position alignment and patterning are carried out by the photolithography technology using an alignment mark previously formed on the surface of the LSI chip 1, and then the first resin coat layer 3 is etched by the dry etching technology, thereby forming contact holes 31 in the LSI pads 2 as shown in FIG. 17A. If a photosensitive resin coat material is used as the material for the first resin coat layer 3 and is directly patterned using the photolithography technology, the number of processes can be reduced.

Figure 17B:
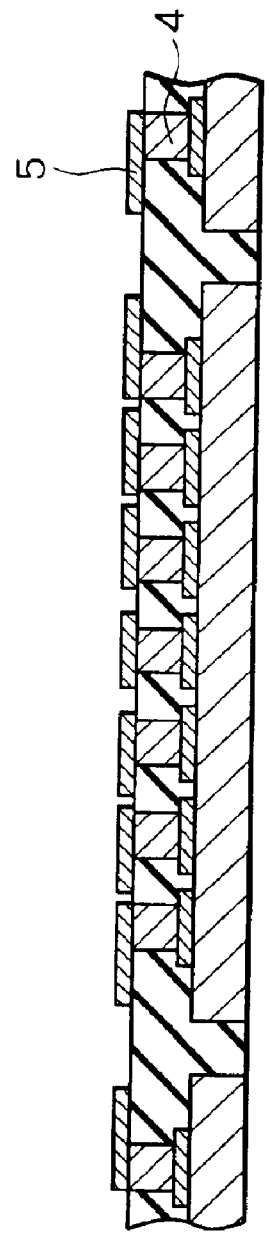

Next, the contact holes 31 are buried with a metal material, such as a copper plated film, by depositing a metal plated film of copper or the like on the entire surface of the wafer 21 by electroless plating and then depositing a metal plated film of copper or the like by electrolytic plating. Thereafter, unnecessary metal materials deposited on the surface or the like of the first resin coat layer 3 are removed by an etch-back scheme, thereby forming the first contact electrodes 4. Instead of the plating scheme, a scheme of directly burying the contact holes 31 with a conductive resin or the like may be taken. Next, as shown in FIG. 17B, metal, such as copper, is deposited on the entire surface of the wafer 21 with the first contact electrodes 4 formed thereon by the electroless plating or electrolytic plating, after which alignment and formation of the desired wire pattern are performed by the photolithography technology, thus forming the intermediate wire layer 5 on the first resin coat layer 3 including those lying above the first contact electrodes 4. Instead of those plating schemes, a scheme of adhering a conductive sheet or the like onto the wafer 21 having the first contact electrodes 4 formed thereon and then exposing a wire pattern by the photolithography technology may be used.

Then, as shown in FIGS. 18A and 18B, the second resin coat layer 6 is formed in the same method as used in forming the first resin coat layer 3, and the second contact electrodes 7 are formed in the same method as used in forming the contact holes 31 and the first contact electrodes 4. Next, the CSP pads 8 are formed on the second resin coat layer 6 including those portions lying above the second contact electrodes 7 by the same plating schemes and photolithography technology as used in forming the intermediate wire layer 5. Like the intermediate wire layer 5, the CSP pads 8 may be formed by adhesion of a conductive sheet and the photolithography technology. Alternatively, a film (not shown) plated with nickel, gold or the like may be deposited on the CSP pads 8 to be able to improve the adhesion of the CSP pads or solder balls or the like formed on the CSP pads 8 in the next process. The CSP bumps 9 are formed on the CSP pads 8 by pressure-bonding gold or the like onto the CSP pads 8 while applying a heat of about 300° C. The CSP bumps 9 may be formed by pressure-bonding solder bumps, instead of gold or the like, onto the CSP pads 8 while applying a heat of about 240° C. Further, solder balls may be attached instead of the gold or solder bumps. The CSP bumps 9 and solder balls which are formed in the above manners have diameters of 300 $\mu$m to 500 $\mu$m.

Finally, as shown in FIG. 18B, the first resin coat layer and second resin coat layer that bury the gaps provided between the LSI chips 1 are cut by a diamond cutter or a laser or the like, which completes the fabrication of each semiconductor CSP type package 11.

The number of intermediate wire layers 5 is not particularly limited, and plural intermediate wire layers 5 can be laminated as needed. In case where two or more intermediate wire layers 5 are laminated, the process of forming the first resin coat layer 3, the first contact electrodes 4, the intermediate wire layer 5 or the CSP pads 8 should be repeated by the required number of times. The method of forming the first contact electrodes 4 is not limited to the method involving the plating scheme and etch-back scheme but it may be replaced with a method of forming columnar posts of copper or the like on the LSI pads 2 and the intermediate wire layer 5 and burying the areas around the posts with an insulative resin of epoxy resin or the like in a method similar to the mold sealing scheme. With regard to the method of forming the external terminal portions comprised of the CSP pads 8 and the CSP bumps 9, the CSP bumps 9 or solder balls or the like may be formed directly on the surfaces of the second contact electrodes 7 without forming the CSP pads 8.

According to the embodiment, the first contact electrodes 4 and the second contact electrodes 7 have diameters of about 50 $\mu$m to 100 $\mu$m and are formed of metal, such as copper, or a conductive resin or the like deposited by the plating scheme. The intermediate wire layer 5 and the CSP pads 8 are formed by patterning a metal, such as copper, deposited by a known plating scheme or the like, using the photolithography technology as done in the rewiring technology that is used in the conventional wafer level CSP technology. The resin coat material that is used for forming the first resin coat layer 3 and the second resin coat layer 6 is formed to a thickness of about 10 $\mu$m to 100 $\mu$m by a resin of a low fluidity with a high heat resistance and excellent mold adhesion, which is used as a wafer coat material in the conventional wafer level CSP technology.

According to the embodiment, the wafer 21 on which the LSI chips 1 are formed is adhered onto a spreadable sheet or the like, such as an electron sheet or an epoxy resin film and is diced to separate the LSI chips 1 into individual pieces, then the sheet or the like is stretched isotropically to provide gaps of equal intervals around the LSI chips 1. Then, the gaps are buried with an insulative resin to expand the area where the intermediate wire layer 5 is formed. According to the embodiment, the external-terminal mounting area extending outward from the peripheral edge of the LSI chip 1 is provided by forming the CSP pads 8 and the CSP bumps 9 on the insulative resin buried in the gaps. Therefore, the CSP bumps 9 can be formed outside the peripheral edge of the LSI chip 1 at wider pitches than the pitches of the LSI pads 2.

Figure 19A:
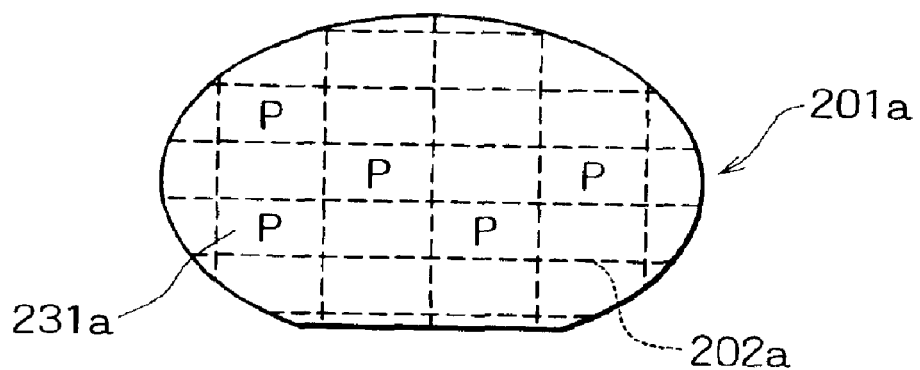
FIG. 19 is a diagram illustrating a fabrication process for a second embodiment of the invention.
Figure 19B:
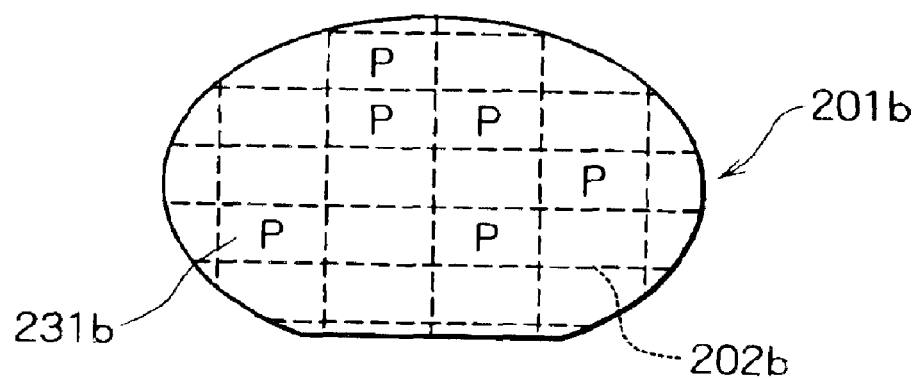

The second embodiment of the invention will be discussed specifically by referring to the accompanying drawings. FIGS. 19A to 21B are diagrams illustrating a fabrication process for a semiconductor CSP type package according to the second embodiment of the invention. As shown in FIG. 19, marks "P" are given to those good pellets in LSI chips formed on wafers 201a and 201b which show characteristics equal to or better than the rated values that guarantee the quality. In the fabrication process of the embodiment, first, wafers on which LSI chips are formed are screened by a P/W test, after which the wafers 201a and 201b which contain good pellets 231a and 231b are cut along scribe lines 202a and 202b respectively to separate the individual LSI chips and screen for the good pellets.

Figure 20:
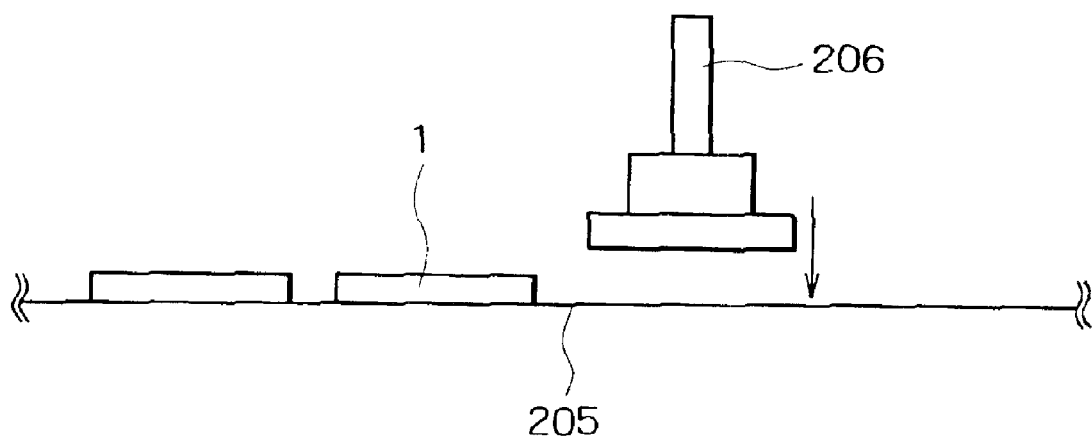
FIG. 20 is a diagram illustrating a fabrication process following the process shown in FIG. 19.
Figure 21A:
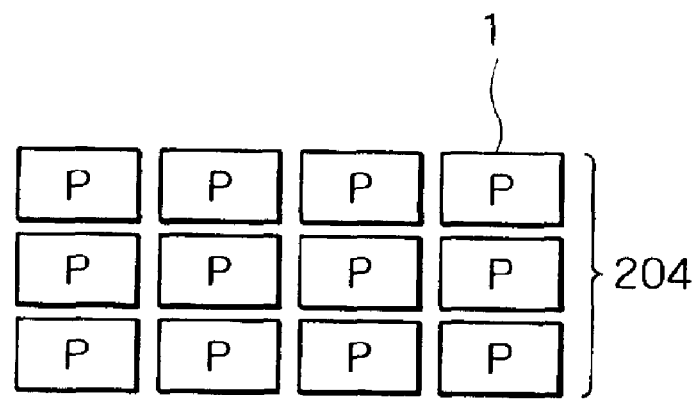
FIGS. 21A and 21B are diagrams illustrating a fabrication process following the process shown in FIG. 20.

Next, as shown in FIG. 20, the good pellets 231a and 231b are extracted from the respective wafers 201a and 201b by using a jig such as a pellet chuck jig which is used in the assembling and mounting process, and are laid on a sheet or stage 205 or the like at equal pitches, forming a good pellet group 204 as shown in FIG. 21A.

Figure 21B:
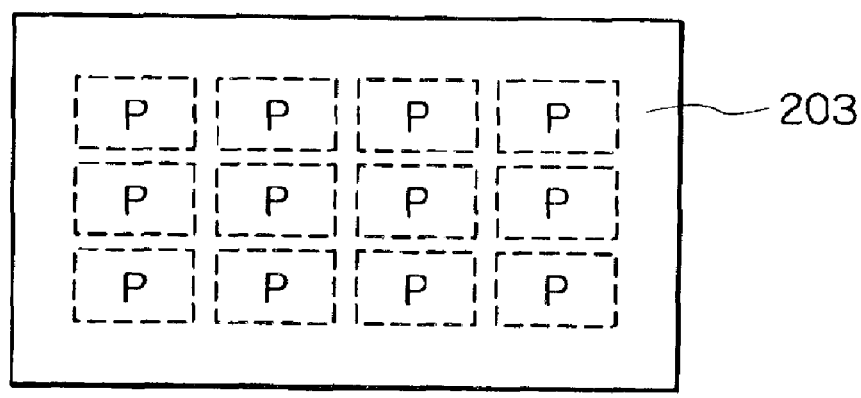

Next, as shown in FIG. 21B, a resin coat 203 is applied to the surface of the good pellet group 204 in such a way as to entirely cover the good pellet group 204. Then, the semiconductor CSP type package 11 is formed by the same method as used in the first embodiment. In the second embodiment, it is possible to extract only good pellets from a wafer where LSI chips are formed and transfer the good pellets to the package forming process. This can eliminate the wasteful step of packaging bad pellets and can thus suppress an increase in fabrication cost.

Figure 23:
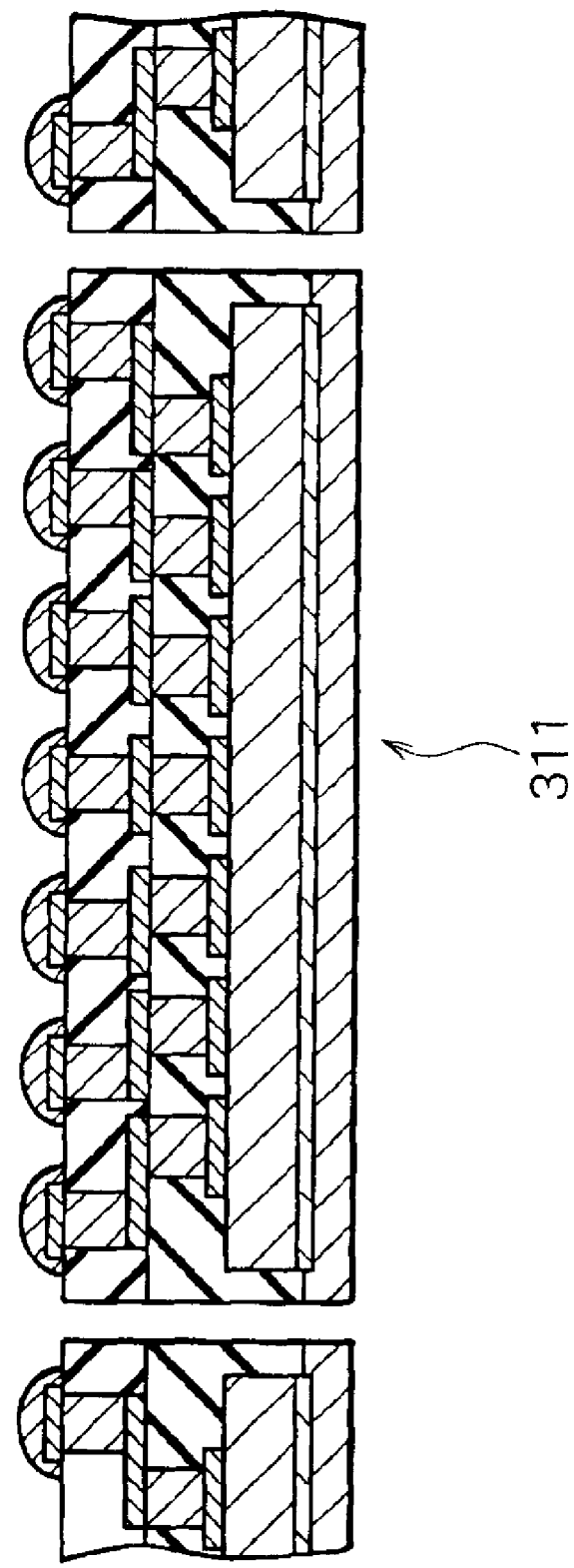
FIG. 23 is a cross-sectional view showing the third embodiment of the present invention.

The third embodiment of the invention will be discussed specifically by referring to the accompanying drawings. FIGS. 22A and 22B and FIG. 23 are diagrams illustrating a fabrication process for a semiconductor CSP type package according to the third embodiment of the invention. In the embodiment, as per the second embodiment, wafers on which LSI chips are formed are screened by a P/W test, after which the wafers are diced to separate the individual LSI chips and screen for good pellets. LSI chips 301 or good pellets are pressure-bonded onto a metal plate 340 of copper or the like which has a thickness of about 1 mm and which has an adhesive 341 of a metal paste or the like essentially consisting of silver applied to that portion where the LSI chips 301 are mounted, as shown in FIG. 22A, and are adhered onto the metal plate 340 by baking at about 150° C. for two to three hours. Then, as shown in FIG. 22B, a first resin coat layer 303 is formed and an external-terminal mounting area is formed on a portion outward of the peripheral edge of the LSI chip 301, by the same method as used in the first embodiment. Then, the first contact electrodes, the intermediate wire layer, the second resin coat layer, the second contact electrodes, the CSP pads and the CSP bumps are formed by the same method as used in the first embodiment, which completes a semiconductor CSP type package 311 as shown in FIG. 23.

According to the embodiment, the metal plate 340 can serve as a reinforcing plate which prevents the package body from being warped after the semiconductor CSP type package 311 is completed and sever also as a heat spreader to let the heat, generated when the LSI chip 301 operates, escape. An Au—Si tape or the like may be used instead of the silver paste as an adhesive to adhere the LSI chips 301 onto the metal plate 340. The metal plate 340 may be replaced with a polyimide tape or the like. Further, a mold resin may be fed into a mold or the like from the sides of the LSI chip 301 to the back thereof. Although the metal plate is used as the board on which the LSI chips 301 are mounted in the third embodiment, the material for the board is not particularly limited and the metal plate may be replaced with a resin or ceramics board and a polyimide resin film.

As elaborated above, the semiconductor CSP type package according to the invention is fabricated by the low-cost wafer level CSP technology in such a way that its planar size becomes greater than the size of the LSI chip to be mounted. This can provide an external-terminal forming area on a portion lying outward of the periphery of the LSI chip and widen the layout pitches of external terminals. It is therefore possible to facilitate the wire layout design on an external board which are to be connected to the external terminals, avoid the multilayering of wires on the external board, thereby suppressing an increase in fabrication cost and shortening the fabrication period.

What is claimed is:
1. A fabrication method for a semiconductor CSP type package, comprising the steps of:
 cutting a wafer on which LSI chips with LSI pads are formed to separate said LSI chips;
 providing gaps around said LSI chips at equal intervals to array said LSI chips;
 filling said gaps with a chip layer insulative resin and allowing the resin to cure;
 forming at least one wire layer electrically connected to the LSI pads and at least one wire layer resin;
 forming CSP pads on the wire layer resin electrically connected to the at least one wire layer; and
 slicing through the chip layer resin and the at least one wire layer resin to separate the LSI chips from one another to provide a plurality of the CSP packages;
 wherein, in plan view of the CSP package:
 a perimeter of the chip layer resin and wire layer resin lies entirely outside a peripheral edge of said LSI chip; and
 at least one of the CSP pads extends outside the peripheral edge of the LSI chip.

2. The fabrication method according to claim 1, wherein said LSI chips are only those chips which have been screened as good after separation.

3. The fabrication method according to claim 1, wherein said LSI chips are adhered to a substrate with said gaps provided.

4. The fabrication method according to claim 1, wherein said gaps are provided by adhering said wafer to a stretchable sheet, then cutting said wafer to separate said LSI chips and stretching said sheet isotropically.

5. The fabrication method according to claim 1, wherein each of said LSI chips has an alignment mark for photolithography and said alignment mark is used to align patterning on said each LSI chip in said steps of forming said at least one wire layer and said CSP pads.

6. The fabrication method according to claim 5, wherein said LSI chips are only those chips which have been screened as good after separation.

7. The fabrication method according to claim 5, wherein said LSI chips are adhered to a substrate with said gaps provided.

8. The fabrication method according to claim 5, wherein said gaps are provided by adhering said wafer to a stretchable sheet, then cutting said wafer to separate said LSI chips and stretching said sheet isotropically.

9. A fabrication method for a semiconductor CSP type package, comprising the steps of:
 cutting a wafer on which LSI chips with LSI pads are formed to separate said LSI chips;
 separating the LSI chips from one another to provide gaps of predetermined width between adjacent said LSI chips;
 filling said gaps with a chip layer resin and allowing the resin to cure;
 forming at least one wiring layer electrically connected to the LSI pads and covering each said wiring layer with a wiring resin layer;
 forming CSP pads on a topmost said wiring resin layer electrically connected to the at least one wiring layer; and
 slicing through the cured chip layer resin and the at least one cured wiring resin layer to separate the LSI chips from one another to provide a plurality of the CSP packages;

wherein, in plan view of the CSP package;
a perimeter of the chip layer resin and each said wiring resin layer lies entirely outside a perimeter of said LSI chip; and
at least one of the CSP pads extends outside the peripheral edge of the LSI chip.

10. A fabrication method for a semiconductor CSP type package, comprising the steps of:

attaching a wafer on which LSI chips with LSI pads are formed to a stretchable sheet;

cutting the wafer to separate said LSI chips;

stretching the sheet isotropically to separate the LSI chips from one another to provide gaps of predetermined width between adjacent said LSI chips;

with the LSI chips held in place, filling said gaps with a chip layer resin and allowing the resin to cure;

forming at least one wiring layer electrically connected to the LSI pads and covering each said wiring layer with a wiring resin layer;

forming CSP pads on a topmost said wiring resin layer electrically connected to the at least one wiring layer such that at least one of the CSP pads extends outside a peripheral edge of the LSI chip; and slicing through the cured chip layer resin and the at least one cured wiring resin layer to separate the LSI chips from one another to provide a plurality of the CSP packages.

* * * * *